United States Patent [19]
Teel

[11] Patent Number: 5,917,353
[45] Date of Patent: Jun. 29, 1999

[54] CLOCK PULSE EXTENDER MODE FOR CLOCKED MEMORY DEVICES HAVING PRECHARGED DATA PATHS

[75] Inventor: Thomas Austin Teel, Austin, Tex.

[73] Assignee: STMicroelectronics, Inc., Carrollton, Tex.

[21] Appl. No.: 08/848,342

[22] Filed: Apr. 30, 1997

Related U.S. Application Data

[63] Continuation of application No. 08/388,755, Feb. 15, 1995, abandoned.

[51] Int. Cl.⁶ ........................................................ H03K 7/08
[52] U.S. Cl. ............................ 327/176; 327/264; 327/285
[58] Field of Search ..................................... 327/291, 292, 327/261, 262, 263, 270, 276, 172, 173, 174, 264, 175, 176, 277, 278, 281, 283, 269, 271

[56] References Cited

U.S. PATENT DOCUMENTS

| | | | |
|---|---|---|---|
| 3,622,809 | 11/1971 | Williams ................................. | 327/272 |
| 4,584,698 | 4/1986 | Sibigtroth et al. ....................... | 327/261 |
| 5,095,232 | 3/1992 | Hirano et al. ............................ | 327/261 |
| 5,163,168 | 11/1992 | Hirano et al. ........................... | 327/176 |
| 5,294,848 | 3/1994 | Kannegundla .......................... | 327/261 |
| 5,319,253 | 6/1994 | You ........................................ | 327/261 |
| 5,389,828 | 2/1995 | Tago ....................................... | 327/263 |
| 5,420,467 | 5/1995 | Huott et al. ............................. | 327/174 |
| 5,428,309 | 6/1995 | Yamauchi et al. ...................... | 327/262 |
| 5,451,894 | 9/1995 | Guo ........................................ | 327/277 |
| 5,459,422 | 10/1995 | Behrin .................................... | 327/270 |
| 5,465,065 | 11/1995 | Stevens .................................. | 327/276 |

*Primary Examiner*—Kenneth B. Wells
*Attorney, Agent, or Firm*—Theodore E. Galanthay; Lisa K. Jorgenson; Renee M. Larson

[57] ABSTRACT

According to the present invention, clock control logic circuitry of a clocked memory device using precharged data path techniques generates a self-timed pulse. The self-timed pulse is representative of a pulsed path active strobe or a reset strobe of the clocked memory device. The clock control logic circuitry of the present invention is characterized as having at least a first delay timing chain, a second delay timing chain, and means for selectively changing the width of a self-timed pulse generated by the clock control logic circuitry. Selectively changing the width of the self-timed pulse is accomplished by selectively adding the delay of the first delay timing chain to the delay of the second delay timing chain during a special mode of operation of the clocked memory device. Selectively changing the width of the self-timed pulse allows a user to compensate for variations in the width of the self-timed pulse which may be caused by process parameter variations, voltage variations, and external temperature bias, for instance, such that the self-timed pulse has an optimal width for both correct circuit action and maximum clock frequency of the clocked memory device.

20 Claims, 2 Drawing Sheets

CLOCK PULSE EXTENDER MODE FOR CLOCKED MEMORY DEVICES HAVING PRECHARGED DATA PATHS

This is a Continuation of application Ser. No. 08/388,755, filed on Feb. 15, 1995, now abandoned.

BACKGROUND OF THE INVENTION

The present invention relates generally to integrated circuit devices, and more specifically to a clock pulse extender mode for clocked memory devices having precharged data paths.

High speed clocked memory devices can often enhance their overall memory access delay time by using precharged data path techniques for both the address decode path and the data sense/output path of a memory device. Examples of memory devices include, but are not limited to, random access memories (RAMs), static random access memories (SRAMs), and burst mode RAMs (BRAMs). Use of these precharged data path techniques increases effective gate fanout for the data path (or address decode path) of the high speed clocked memory device. Implementation of these techniques often requires that the address decode path and/or the data sense/output path of the memory device be precharged (or preset) to a known state, typically inactive, prior to allowing new data such as address inputs or array data entry into the precharged path. Input entry into the address decode path or the data sense/output path is often gated by a pulsed path active strobe that has a pulse width of self-timed duration. After the pulsed path active strobe becomes inactive, a reset (or precharge) strobe is applied to the path stages in a parallel manner to return the path to its inactive state. The minimum clock period for this type of precharged data path is equal to the data delay through the path plus the path precharge time.

From the above description it can be seen that a small self-timed pulse width for both the pulsed path active strobe and the reset strobe is desirable for a high speed clock cycle in order to obtain the minimum clock period of the memory device. Conversely, the width of the self-timed strobes must also be of long enough duration to allow the active data path to resolve, i.e. to stabilize to an appropriate state in response to an input stimulus such as an input address, and and to fully return the inactive data path to the proper initial condition.

These self-timed pulses of the pulsed path active strobe and the reset strobe are often generated using a gate delay timing chain. The pulse duration of these self-timed pulses may be subject to large variation. This may be especially the case where the gate delay timing chain of a high speed clocked memory device is designed using a complementary metal oxide semiconductor (CMOS) process and large variations of the width of self-timed pulses may be due to process parameter variations, voltage variations, and external temperature bias. This inherent pulse width variation of the self-timed pulses makes it difficult to both make the timed pulse criteria of long enough duration for correct circuit action while making it of minimum width in order to achieve maximum clock frequency. When the circuit under design is completely new, or being designed to a new process, or both, it is advantageous to have a method which will enable the design to be verified even if the self-timed pulse width variation is more than anticipated.

SUMMARY OF THE INVENTION

It would be advantageous in the art to have a pulsed path active strobe of self-timed duration, which gates data entry into a precharged path of a clocked memory device, where the self-timed duration is short enough in order to obtain the minimum clock period of the clocked memory device and long enough in order to allow the active data path to resolve, i.e. to stabilize to an appropriate state in response to an input stimulus such as an input address.

It would further be advantageous in the art to have a reset (or precharge) strobe of self-timed duration, which allows the paths of the clocked memory device to return the path to its inactive state, where the self-timed duration is short enough in order to obtain the minimum clock period of the clocked memory device and long enough to allow the inactive data path to fully return to a proper initial condition.

It would even further be advantageous in the art to be able to compensate for variations in the width of self-timed pulses of a pulsed path active strobe and a reset strobe caused by process parameter variations, voltage variations, and external temperature bias such that the self-timed pulses are both of long enough duration for correct circuit action and of short enough duration for maximum clock frequency of the clocked memory device.

Therefore, according to the present invention, clock control logic circuitry of a clocked memory device using precharged data path techniques generates a self-timed pulse. The self-timed pulse is representative of a pulsed path active strobe or a reset strobe of the clocked memory device. The clock control logic circuitry of the present invention is characterized as having at least a first delay timing chain with a clock input signal and an output signal, a second delay timing chain with the output signal of the first delay timing chain as an input signal and an output signal, and means for selectively changing the width of the self-timed pulse generated by the clock control logic circuitry. The means for selectively changing the width of the self-timed pulse is a logic gating function, comprised of one or more logic gates such as NOR gates, which is capable of selectively adding together the delay of the first delay timing chain and the delay of the second delay timing chain.

There are two modes of operation of the clocked memory device: a normal operating mode and a special operating mode. During the normal operating mode, the width of the self-timed pulse width remains unchanged and is equal to the delay of the first delay timing chain. During the special operating mode, the width of the self-timed pulse width increases and is equal to the summation of the delay of the first delay timing chain and the delay of the second delay timing chain. Selectively changing the width of the self-timed pulse allows a user to compensate for variations in the width of the self-timed pulse which may be caused by process parameter variations, voltage variations, and external temperature bias, for instance, such that the self-timed pulse has an optimal width for both correct circuit action and maximum clock frequency of the clocked memory device.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention addresses concerns with the duration and stability of self-timed pulse widths of both a pulsed path active strobe and a reset (or precharge) strobe of a clocked memory device using precharged data path techniques. The clocked memory device may be, but is not limited to, a RAM, a SRAM, and a BRAM. According to the present invention, a pulsed path active strobe which gates data entry into a precharged path of a clocked memory device has a self-timed duration which is short enough to ensure a minimum clock period of the clocked memory device while also being long enough to allow the active data path of the clocked memory device to resolve, i.e. to stabilize to an appropriate state in response to an input stimulus such as an input address. The present invention ensures that the self-timed duration of a reset (or precharge) strobe which allows the path stages of the clocked memory device to return the path to its inactive state has a self-timed duration which is short enough to obtain a minimum clock period of the clocked memory device, yet long enough to allow the inactive data path to fully return to a proper initial condition. Additionally, the present invention compensates for variations in the width of self-timed pulses of a pulsed path active strobe and a reset strobe caused by process parameter variations, voltage variations, and external temperature bias such that the self-timed pulses are both of long enough duration for correct circuit action and of short enough duration for maximum clock frequency of the clocked memory device.

Figure 1:
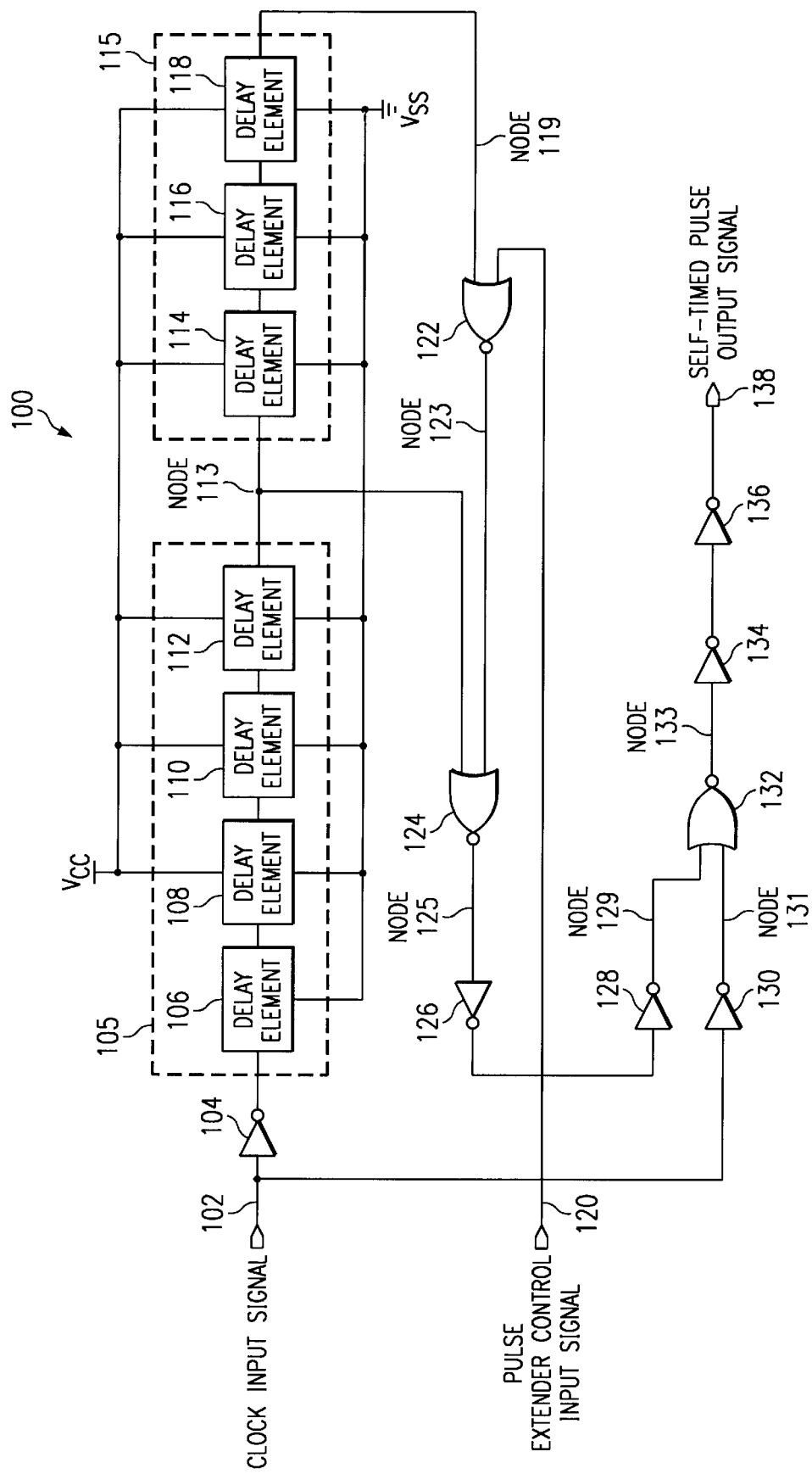
FIG. 1 is a schematic diagram of clock control logic which provides for a self-timed clock pulse extender mode, according to the present invention.
Figure 2:
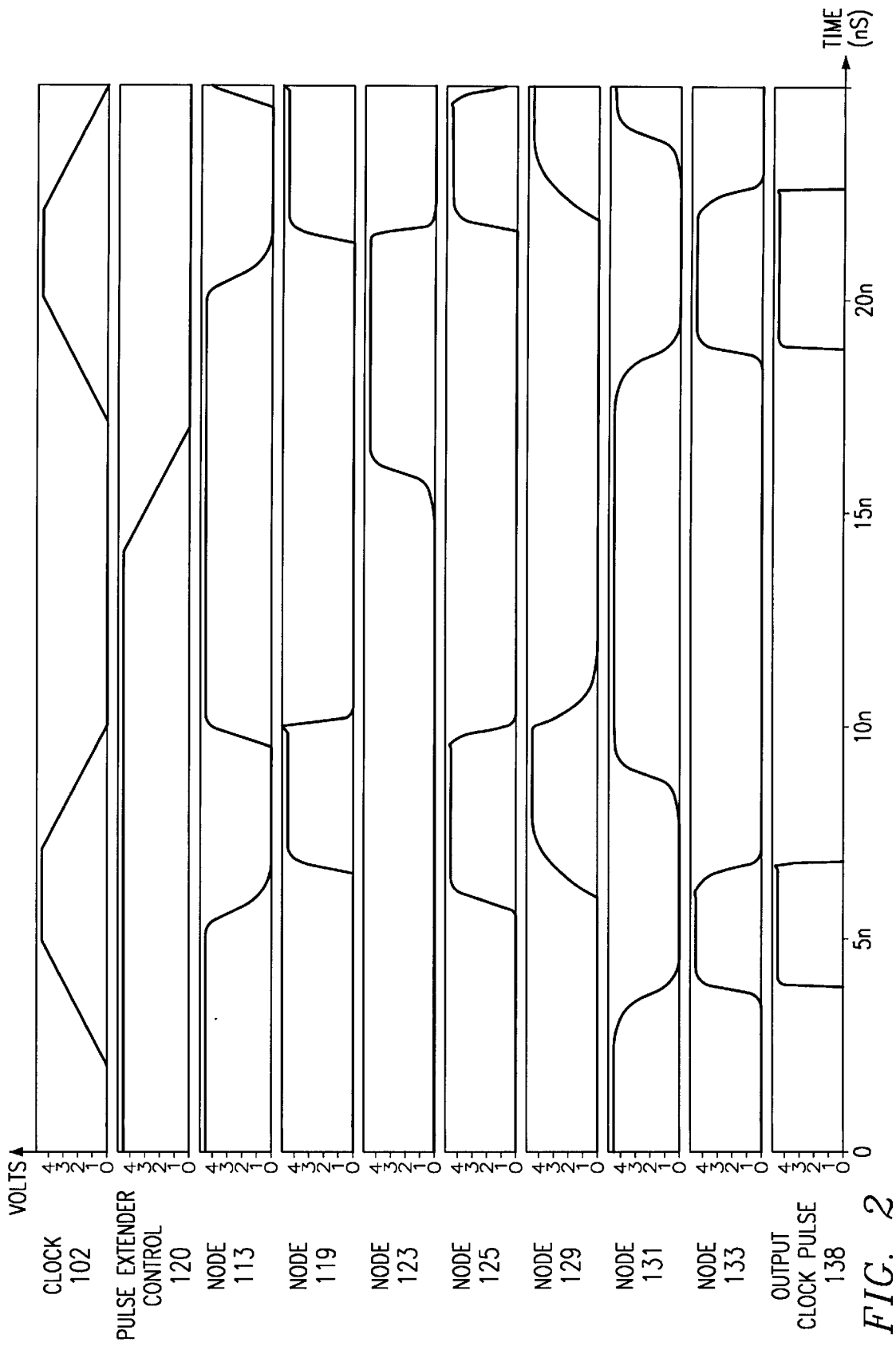
FIG. 2 is a circuit timing diagram of the clock control logic of FIG. 1, according to the present invention.

A preferred embodiment of the present invention provides for the implementation of a self-timed clock pulse extender mode of a clocked memory device, such as a Burst RAM (BRAM). A schematic diagram of clock control logic 100 which allows for the self-timed clock pulse extender mode is shown in FIG. 1. A circuit timing diagram of clock control logic 100 is shown in FIG. 2.

Referring to FIG. 1, a schematic diagram of clock control logic 100 which provides a self-timed clock pulse extender mode of a clocked memory device is shown. Clock control logic 100 is supplied with a Clock input signal 102 and a Pulse Extender Control input signal 120 and is comprised of the following circuit elements: inverters 104, 126, 128, 130, 134, 136, a first delay timing chain 105 consisting of delay elements 106, 108, 110, 112, a second delay timing chain 115 consisting of delay elements 114, 116, 118, and NOR logic gates 122, 124, 132. Self-timed Pulse output signal 138 is the output signal of clock control logic 100.

Clock input signal 102 is a derivative of a master clock signal of the synchronous memory device which is not shown here. During normal operation, Pulse Extender Control input signal 120 is inactive (logic high) and when Clock input signal 102 is an active high signal, the width of Self-timed Clock Pulse output signal 138 is determined by the delay time of first delay timing chain 105 comprised of delay elements 106, 108, 110, and 112. When Clock input signal 102 is an active high signal, a delay output signal from delay element 112 of first delay timing chain 105 at node 113 is a first input signal to NOR logic gate 124. Since during normal operation, Pulse Extender Control input signal 120 is logic high, the output signal of NOR logic gate 124 at node 125 is not determined by the delay of second delay timing chain 115. The output signal of NOR logic gate 124 is passed through inverters 126 and 128 before the output of inverter 128 at node 129 is presented as an input signal to NOR logic gate 132; the second input signal to NOR logic gate 132 is the inverted signal of Clock input signal 102 at node 131; this inverted signal is generated by passing Clock input signal 102 through inverter 130. The extended output signal of NOR logic gate 132 at node 133 passes through inverters 134 and 136, which act as buffers, before being presented as Self-timed Pulse output signal 138.

However, when it is desired to extend the duration of Self-timed Clock Pulse output signal 138, Clock input signal 102 is active and Pulse Extender Control input signal 120 is forced to an active (logic low) state and the delay time of the second delay timing chain 115 at node 119, determined by delay elements 114, 116, and 118, is added to the delay time of the first delay timing chain 105 at node 113, to render a longer delay time, thereby extending the width of the Self-timed Clock Pulse output signal 138. Thus, during a special mode such as a test mode it is possible to extend the duration of the Self-timed Clock Pulse output signal 138 by forcing Pulse Extender Control input signal 120 to an active state when Clock input signal 102 is also an active signal.

According to the invention, the duration of the Self-timed Clock Pulse output signal 138 may be substantially increased from a default width determined by the delay time of the first delay timing chain 105 to a second, longer pulse width, as a function of the delay elements of the second delay timing chain 115. For instance, referring to the timing diagram of FIG. 2, bringing Pulse Extender Control input 120 signal to an active low logic state increases the duration of Self-timed Clock Pulse output signal 138 from a duration of approximately 2.7 nS to approximately 3.7 nS. It is anticipated and indeed expected that any desired increase in output signal duration may be achieved through appropriate selection of the delay elements of the second delay timing chain 115. For instance, utilizing additional delay elements in conjunction with delay elements 114, 116, and 118 of the second delay timing chain 115 would allow a greater delay to be introduced to Self-timed Clock Pulse output signal 138 and thus a greater extension of the width of Self-timed Clock Pulse output signal 138 may be achieved. Thus, through judicial selection of additional delay elements of second delay timing chain 115 virtually any desired measure of additional delay time may be introduced to Self-timed Clock Pulse output signal 138. Of course, a person using the present invention would need to determine how much extension of the width of Self-timed Clock Pulse outputs signal could be achieved without unduly and adversely affecting the maximum clock frequency of the clocked memory device.

Clock control logic 100 of FIG. 1 illustrates use of Pulse Extender Control input signal 120, a function of a special mode such as a test mode, to control additional delay. It is anticipated and allowed for that Pulse Extender Control input signal 120 may be representative of any control signal. Thus, in addition to a test mode control signal, Pulse Extender Control input signal 120 may also be representative of a fuse-based control signal which may be utilized to introduce desired additional delay of the second delay timing chain 115.

Referring to FIG. 2, the timing diagram of clock control logic 100 of FIG. 1 is shown. The following signals are represented in FIG. 2: Clock input signal 102, Pulse Extender Control input signal 120, Node 113, Node 119, Node 123, Node 125, Node 129, Node 131, and Node 133. The timing diagram illustrates the timing of these signals in a normal operation mode when Control input signal 102 is active and Pulse Extender Control input signal 120 is inactive (logic high) and during a special mode when both Control input signal 102 and Pulse Extender Control input signal 120 are active (logic low). Specifically, it is important to note that during a special mode when Pulse Extender Control input signal 120 is active, the timing diagram of FIG. 2 illustrates that the width of Self-timed Pulse output signal 138 increases from approximately 2.7 nS to approximately 3.7 nS.

The present invention provides for the use of precharged data path techniques of clocked memory devices whose self-timed pulsed path active strobe and/or reset strobe are subject to variations in pulse width; these variations, such as process parameter variations, voltage variations, and external temperature bias, may be especially acute when a clocked memory device is fabricated using a CMOS process. According to the present invention, the width of self-timed pulsed path active and/or reset strobes of a clocked memory device compensate for these variations such that the self-timed pulse width is of long enough duration to allow the active data paths to resolve, i.e. to stabilize to an appropriate state in response to an input stimulus such as an input address, and to fully return the inactive data paths to proper initial condition, while being of short enough duration to obtain a minimum clock period of the clocked memory device.

While the invention has been particularly shown and described with reference to a preferred embodiment, it will be understood by those skilled in the art that various changes in form and detail may be made therein without departing from the spirit and scope of the invention.

What is claimed is:

1. Clock control logic circuitry for generating a self-timed pulse of a clocked memory device, comprising:
    a first delay timing chain characterized as having a first delay time, a clock input signal, and a first output signal;
    a second delay timing chain characterized as having a second delay time, an input signal determined by the first output signal of the first delay timing chain, and a second output signal; and
    means for selectively adding the first delay time of the first delay timing chain to the second delay time of the second delay timing chain in order to generate a pulse output signal of the clock control logic circuitry characterized as having a first pulse width during a special mode of operation of the clocked memory device defined by the clock input signal of the first delay timing chain being equal to an active state and a control input signal of the means for selectively adding being equal to an active logic state, wherein the first pulse width is equal to a summation of the first delay time and the second delay time and wherein during a normal mode of operation of the clocked memory device, defined by the clock input signal of the first delay timing chain being equal to the active state and the control input signal of the means for selectively adding being equal to an inactive logic state, the pulse output signal of the clock control logic circuitry has a second pulse width equal to the first delay time of the first delay timing chain, and
    wherein the clock input signal need only transition from an inactive state to the active state for the means for selectively adding to generate the pulse output signal having the first pulse width when the control input signal is equal to the active logic state and to generate the pulse output signal having the second pulse width when the control input signal is equal to the inactive logic state.

2. The clock control logic circuitry of claim 1, wherein the self-timed pulse is a pulsed path active strobe of the clocked memory device.

3. The clock control logic circuitry of claim 1, wherein the self-timed pulse is a reset strobe of the clocked memory device.

4. The clock control logic circuitry of claim 1, wherein the self-timed pulse is a precharge strobe of the clocked memory device.

5. The clock control logic circuitry of claim 1, wherein the first delay timing chain comprises a first plurality of delay elements.

6. The clock control logic circuitry of claim 1, wherein the second delay timing chain comprises a second plurality of delay elements.

7. The clock control logic circuitry of claim 1, wherein the means for selectively adding the first delay time of the first delay timing chain to the second delay time of the second delay timing chain in order to generate a third output signal is characterized as having the first pulse width comprises a logic gating circuit having the first output signal of the first delay timing chain as a first input signal, the second output signal of the second delay timing chain as a second input signal, the control signal as a third input signal, the clock input signal of the first delay timing chain as a fourth input signal, and the third output signal as an output signal.

8. The clock control logic circuitry of claim 1, wherein the clocked memory device is a random access memory (RAM).

9. The clock control logic circuitry of claim 1, wherein the clocked memory device is a static random access memory (RAM).

10. The clock control logic circuitry of claim 1, wherein the clocked memory device is a burst mode RAM (BRAM).

11. The clock control logic circuitry of claim 1, wherein the control input signal is a test mode control signal.

12. A clock control logic circuitry for generating a self-timed pulse of a clocked memory device, comprising:
    a first delay timing chain characterized as having a first delay time, a clock input signal, a plurality of delay elements which determine the value of the first delay time, and a first output signal;
    a second delay timing chain characterized as having a second delay time, an input signal determined by the first output signal of the first delay timing chain, a plurality of delay elements which determine the value of the second delay time, and a second output signal; and
    a logic gating circuit having the first output signal of the first delay timing chain as a first input signal, the second output signal of the second delay timing chain as a second input signal, a control signal as a third input signal, the clock input signal of the first delay timing chain as a fourth input signal, and a third output signal as an output signal; wherein during a special mode of operation of the clocked memory device, defined by the clock input signal of the first delay timing chain being equal to an active logic state and the control signal of the logic gating circuit being equal to an active logic state, the logic gating circuit selectively adds the first delay time of the first delay timing chain to the second delay time of the second delay timing chain in order to generate a pulse output signal of the clock control logic circuitry characterized as having a first pulse width equal to a summation of the first delay time and the second delay time and wherein during a normal mode of operation of the clocked memory device, defined by the clock input signal of the first delay timing chain being equal to the active logic state and the control signal of the logic gating circuit being equal to an inactive logic state, the pulse output signal of the clock control logic circuitry has a second pulse width equal to the first delay time of the first delay timing chain, and wherein the clock input signal need only transition from an inactive logic state to the active logic state for the logic gating circuit to generate the output signal having the first pulse width when the control signal is equal to the active logic state and to generate the output signal having the second pulse width when the control signal is equal to the inactive logic state.

13. The clock control logic circuitry of claim 12, wherein the special mode of operation is defined by the clock input signal of the first delay timing chain being equal to an active state and a control input signal of the logic gating circuit being equal to an active logic state.

14. The clock control logic circuitry of claim 12, wherein the self-timed pulse is a pulsed path active strobe of the clocked memory device.

15. The clock control logic circuitry of claim 12, wherein the self-timed pulse is a reset strobe of the clocked memory device.

16. The clock control logic circuitry of claim 12, wherein the self-timed pulse is a precharge strobe of the clocked memory device.

17. The clock control logic circuitry of claim 12, wherein the clocked memory device is a random access memory (RAM).

18. The clock control logic circuitry of claim 12, wherein the clocked memory device is a static random access memory (RAM).

19. The clock control logic circuitry of claim 12, wherein the clocked memory device is a burst mode RAM (BRAM).

20. The clock control logic circuitry of claim 1, wherein the control input signal is a test mode control signal.

* * * * *